US012265431B2

(12) United States Patent
Lee et al.

(10) Patent No.: US 12,265,431 B2
(45) Date of Patent: Apr. 1, 2025

(54) ELECTRONIC DEVICE INCLUDING ELECTRICAL CONNECTION MEMBER

(71) Applicant: Samsung Electronics Co., Ltd., Gyeonggi-do (KR)

(72) Inventors: Sunghyup Lee, Gyeonggi-do (KR); Beomju Kim, Gyeonggi-do (KR); Myunggwan Park, Gyeonggi-do (KR); Jungsik Park, Gyeonggi-do (KR); Yeohwan Yoon, Gyeonggi-do (KR); Hyunwoo Lee, Gyeonggi-do (KR); Yongchan Choi, Gyeonggi-do (KR); Hyunju Hong, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 347 days.

(21) Appl. No.: 17/858,221

(22) Filed: Jul. 6, 2022

(65) Prior Publication Data

US 2023/0004199 A1    Jan. 5, 2023

Related U.S. Application Data

(63) Continuation of application No. PCT/KR2022/008594, filed on Jun. 17, 2022.

(30) Foreign Application Priority Data

Jun. 30, 2021    (KR) .................. 10-2021-0085689

(51) Int. Cl.
*G06F 1/16*    (2006.01)
*H01Q 1/24*    (2006.01)
(Continued)

(52) U.S. Cl.
CPC ........... *G06F 1/1698* (2013.01); *H01Q 1/243* (2013.01); *H01Q 1/38* (2013.01); *H05K 1/189* (2013.01)

(58) Field of Classification Search
CPC .... G06F 1/1658; G06F 1/1686; G06F 1/1688; G06F 1/1698; G06F 1/16; H01Q 1/243;
(Continued)

(56) References Cited

U.S. PATENT DOCUMENTS 8,717,778 B2    5/2014  Tachikawa et al.
8,917,215 B2   12/2014  Pohl
(Continued)

FOREIGN PATENT DOCUMENTS

JP      2008-300635 A    12/2008
KR  10-2009-0032450 A     4/2009
(Continued)

OTHER PUBLICATIONS

International Search Report dated Sep. 29, 2022.
Extended European Search Report dated Sep. 13, 2024.

*Primary Examiner* — Timothy J Thompson
*Assistant Examiner* — Guillermo J Egoavil
(74) *Attorney, Agent, or Firm* — Cha & Reiter, LLC

(57) ABSTRACT

An electronic device includes a housing, a first substrate disposed in an internal space of the housing, a conductive structure disposed at a location isolated from the first substrate, a second substrate electrically connected to the conductive structure and the first substrate, and an electrical connection member electrically connecting the second substrate to the conductive structure. The electrical connection member may include a first fixing portion fixed to the conductive structure, a second fixing portion fixed to the second substrate, and a connection portion connecting the first fixing portion and the second fixing portion. The first fixing portion includes a first bent portion bent along a first bent line from a neck portion, that is, a boundary area with the connection portion, and a second bent portion bent along a second bent line from the first bent portion. The first bent portion is bent in a first direction becoming distant from the (Continued)

conductive structure, and the second bent portion is bent in a second direction opposite to the first direction.

19 Claims, 10 Drawing Sheets

(51) Int. Cl.
    *H01Q 1/38*     (2006.01)
    *H05K 1/18*     (2006.01)

(58) Field of Classification Search
    CPC ............ H01Q 1/38; H01Q 1/24; H01Q 21/30; H01Q 5/307; H05K 1/189; H05K 1/18; H05K 1/182; H05K 2201/10037; H05K 2201/10151; H05K 2201/10265; H05K 2201/10295; H01R 12/718; H01R 12/73; H01R 13/2435; H01R 2201/16
    USPC .............................................. 361/104; 439/81
    See application file for complete search history.

(56) References Cited

U.S. PATENT DOCUMENTS

| | | |
|---|---|---|
| 9,923,264 B2 | 3/2018 | Kim et al. |
| 10,158,163 B2 | 12/2018 | Gang et al. |
| 10,943,748 B2 | 3/2021 | Sanford |
| 11,259,407 B2 | 2/2022 | Shim et al. |
| 2009/0085816 A1 | 4/2009 | So et al. |
| 2012/0176278 A1 | 7/2012 | Merz et al. |
| 2016/0276757 A1 | 9/2016 | Smith et al. |
| 2020/0052428 A1* | 2/2020 | Cho .................. H01R 12/73 |
| 2020/0267847 A1 | 8/2020 | Lee et al. |
| 2020/0375026 A1 | 11/2020 | Shim et al. |

FOREIGN PATENT DOCUMENTS

| | | | |
|---|---|---|---|
| KR | 10-1497855 B1 | 3/2015 | |
| KR | 10-2020-0101178 A | 8/2020 | |
| KR | 10-2020-0134068 A | 12/2020 | |
| WO | WO-2011092499 A1 * | 8/2011 | ............ H01Q 1/243 |

* cited by examiner

ELECTRONIC DEVICE INCLUDING ELECTRICAL CONNECTION MEMBER

CROSS-REFERENCE TO RELATED APPLICATION(S)

This application is a continuation of International Application No. PCT/KR2022/008594, filed on Jun. 17, 2022, which claims priority to Korean Patent Application No. 10-2021-0085689, filed on Jun. 30, 2021 in the Korean Intellectual Property Office, the disclosures of which are herein incorporated by reference.

TECHNICAL FIELD

Certain embodiments of the present disclosure relate to an electronic device including an electrical connection member.

BACKGROUND

An electronic device may include a plurality of electronic parts and components and/or electrical structures that are isolated from one another at designated intervals and electrically connected with each other through an electrical connection member. Through such an isolation deployment, mutual interference between the electronic parts and/or the electrical structures can be minimized and increase design efficiency. efficiently.

Some conductive structures disposed in an electronic device may be electrically connected to a nearby substrate through an electrical connection member. If a distance between the conductive structures and the substrate is relatively large, in the state in which the conductive member has been electrically fixed to a flexible substrate (e.g., a flexible RF cable (FRC) or a flexible printed circuit board (FPCB)), the conductive structures may be electrically connected for operation. For example, at least some conductive structures electrically connected to the substrate may be used as an antenna radiator for communication through at least one wireless communication circuitry disposed in the substrate or may be used for a ground. The electrical connection member may be formed in a metal plate shape, and may be electrically connected in a way to be clamped to the conductive structures through a clamping member, such as a screw.

The electrical connection member may be equipped with a tension structure for preventing loosening after being clamped by a screw. When implementing such a tension structure, the electrical connection member may be deformed when being clamped by the screw.

However, if the electrical connection member has one end fixed to the flexible substrate and the other end clamped to the conductive structures through a screw, deformation caused by a clamping force of the screw or the tension structure of the electrical connection member is delivered to the flexible substrate as a stress concentration phenomenon. As a result, the electrical connection member may be disconnected from the flexible substrate. Furthermore, a phenomenon in which the tension structure is not accurately clamped at corresponding locations of the conductive structures may occur because the tension structure generates deformation of the electrical connection member during screw clamping. Accordingly, there is a need to address these drawbacks.

SUMMARY

Certain embodiments of the present disclosure may provide an electronic device including an electrical connection member having an improved clamping property.

However, an object to be solved in the present disclosure is not limited to the aforementioned object, and may be variously extended without departing from the spirit and scope of the present disclosure.

According to certain embodiments, an electronic device may include a housing, a first substrate disposed in an internal space of the housing, a conductive structure disposed at a location isolated from the first substrate, a second substrate electrically connected to the conductive structure and the first substrate, and an electrical connection member electrically connecting the second substrate to the conductive structure. The electrical connection member may include a first fixing portion fixed to the conductive structure, a second fixing portion fixed to the second substrate, and a connection portion connecting the first fixing portion and the second fixing portion. The first fixing portion may include a first bent portion extending from a neck portion that is, a boundary area of the connection portion and bent along a first bent line, and a second bent portion bent along a second bent line from the first bent portion. The first bent portion may be bent in a first direction and dispose at a distance from the conductive structure. The second bent portion may be bent in a second direction which is opposite to the first direction.

It would be readily apparent that the electrical connection member according to exemplary embodiments of the present disclosure, as explained hereinafter, can help to reduce a stress concentration phenomenon on a flexible substrate attributable to deformation during a clamping operation and also improve clamping reliability because the fixing portion clamped to the conductive structure has an inverse "V" shape twice bent in an opposite direction at a designated location, thereby being stably supported by the conductive structure.

BRIEF DESCRIPTION OF DRAWINGS

In relation to the description of the drawings, the same or similar reference numerals may be used with respect to the same or similar constituent elements, in which in which.

DETAILED DESCRIPTION

Figure 1:
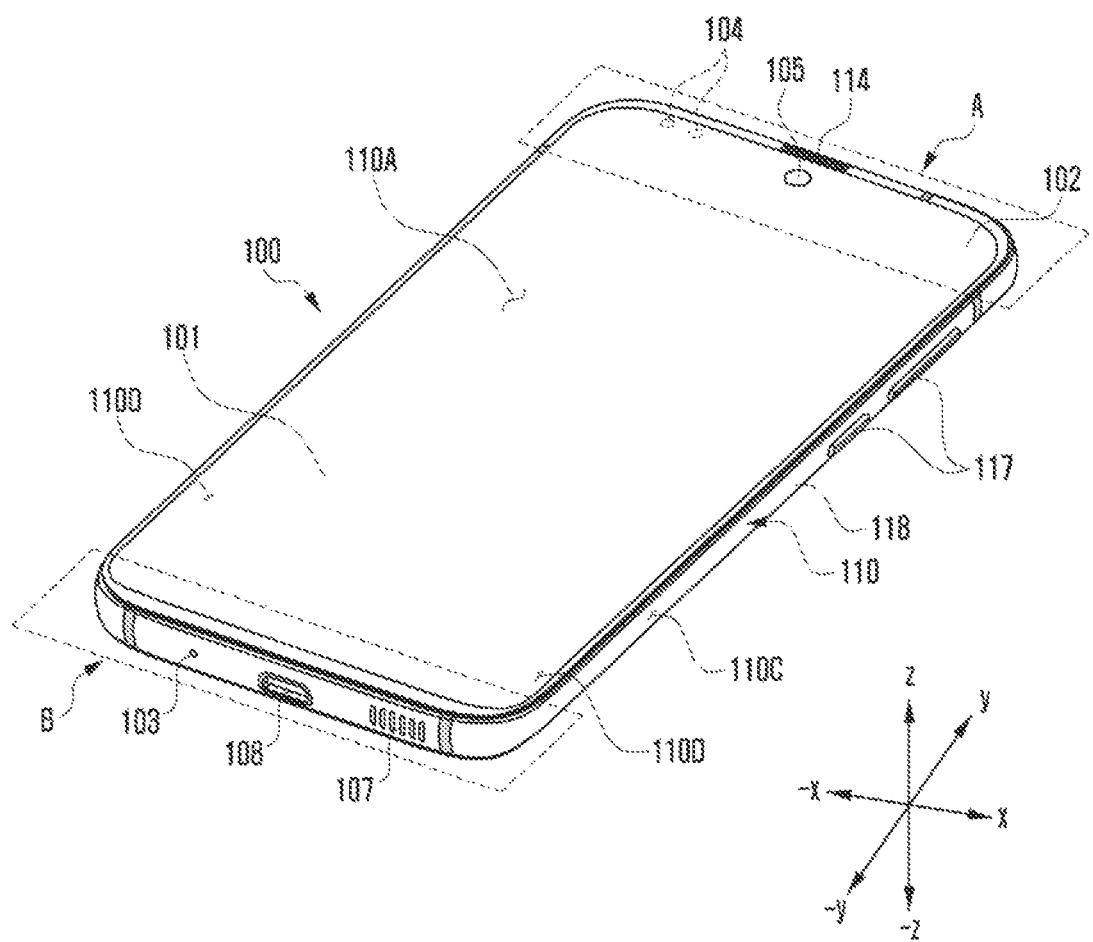
FIG. 1 is a perspective view of the front of an electronic device (e.g., a mobile electronic device) according to certain embodiments of the present disclosure.
Figure 2:
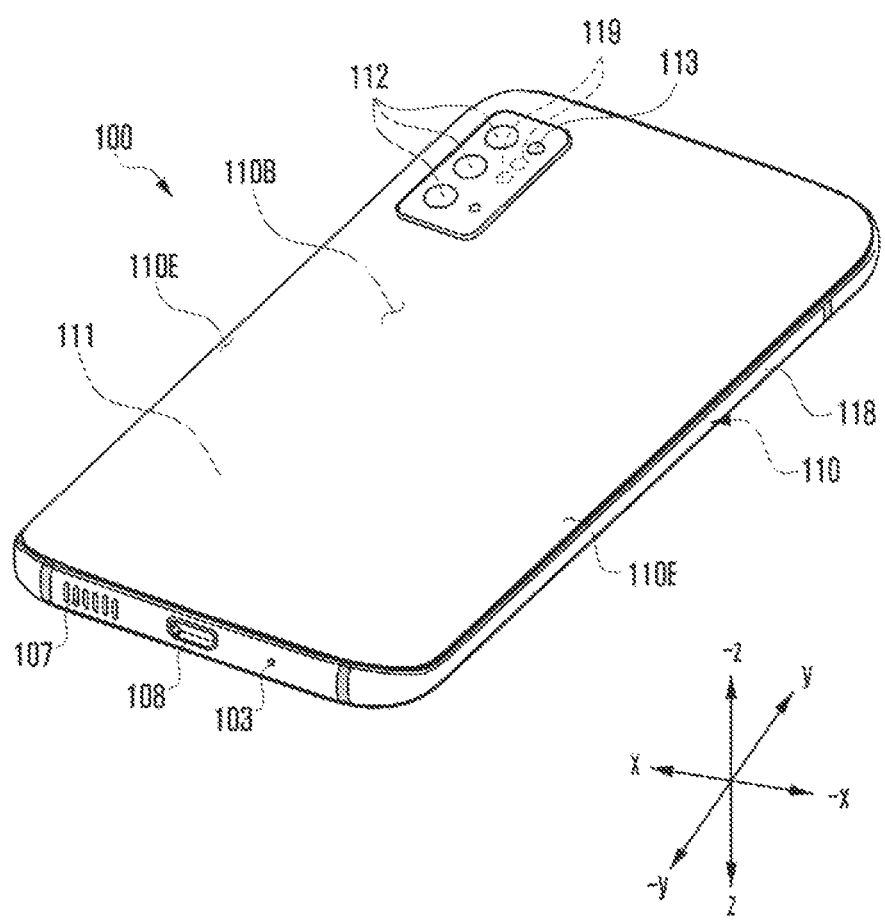
FIG. 2 is a perspective view of the rear of the electronic device of FIG. 1 according to certain embodiments of the present disclosure.

FIG. 1 illustrates a perspective view showing a front surface of a mobile electronic device according to an embodiment of the disclosure, and FIG. 2 illustrates a perspective view showing a rear surface of the mobile electronic device shown in FIG. 1 according to an embodiment of the disclosure.

Referring to FIGS. 1 and 2, a mobile electronic device 100 may include a housing 110 that includes a first surface (or front surface) 110A, a second surface (or rear surface) 110B, and a lateral surface 110C that surrounds a space between the first surface 110A and the second surface 110B. The housing 110 may refer to a structure that forms a part of the first surface 110A, the second surface 110B, and the lateral surface 110C. The first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material such as aluminum).

The front plate 102 may include two first regions 110D disposed at long edges thereof, respectively, and bent and extended seamlessly from the first surface 110A toward the rear plate 111. Similarly, the rear plate 111 may include two second regions 110E disposed at long edges thereof, respectively, and bent and extended seamlessly from the second surface 110B toward the front plate 102. The front plate 102 (or the rear plate 111) may include only one of the first regions 110D (or of the second regions 110E). The first regions 110D or the second regions 110E may be omitted in part. When viewed from a lateral side of the mobile electronic device 100, the lateral bezel structure 118 may have a first thickness (or width) on a lateral side where the first region 110D or the second region 110E is not included, and may have a second thickness, being less than the first thickness, on another lateral side where the first region 110D or the second region 110E is included.

The mobile electronic device 100 may include at least one of a display 101, audio modules 103, 107 and 114, sensor modules 104 and 119, camera modules 105, 112 and 113, a key input device 117, a light emitting device, and connector hole 108. The mobile electronic device 100 may omit at least one (e.g., the key input device 117 or the light emitting device) of the above components, or may further include other components.

The display 101 may be exposed through a substantial portion of the front plate 102, for example. At least a part of the display 101 may be exposed through the front plate 102 that forms the first surface 110A and the first region 110D of the lateral surface 110C. The display 101 may be combined with, or adjacent to, a touch sensing circuit, a pressure sensor capable of measuring the touch strength (pressure), and/or a digitizer for detecting a stylus pen. At least a part of the sensor modules 104 and 119 and/or at least a part of the key input device 117 may be disposed in the first region 110D and/or the second region 110E.

The audio modules 103, 107 and 114 may correspond to a microphone hole 103 and speaker holes 107 and 114, respectively. The microphone hole 103 may contain a microphone disposed therein for acquiring external sounds and, in a case, contain a plurality of microphones to sense a sound direction. The speaker holes 107 and 114 may be classified into an external speaker hole 107 and a call receiver hole 114. The microphone hole 103 and the speaker holes 107 and 114 may be implemented as a single hole, or a speaker (e.g., a piezo speaker) may be provided without the speaker holes 107 and 114.

The sensor modules 104 and 119 may generate electrical signals or data corresponding to an internal operating state of the mobile electronic device 100 or to an external environmental condition. The sensor modules 104 and 119 may include a first sensor module 104 (e.g., a proximity sensor) and/or a second sensor module (e.g., a fingerprint sensor) disposed on the first surface 110A of the housing 110, and/or a third sensor module 119 (e.g., a heart rate monitor (HRM) sensor) and/or a fourth sensor module (e.g., a fingerprint sensor) disposed on the second surface 110B of the housing 110. The fingerprint sensor may be disposed on the second surface 110B as well as the first surface 110A (e.g., the display 101) of the housing 110. The electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112 and 113 may include a first camera device 105 disposed on the first surface 110A of the electronic device 100, and a second camera device 112 and/or a flash 113 disposed on the second surface 110B. The camera module 105 or the camera module 112 may include one or more lenses, an image sensor, and/or an image signal processor. The flash 113 may include, for example, a light emitting diode or a xenon lamp. Two or more lenses (infrared cameras, wide angle and telephoto lenses) and image sensors may be disposed on one side of the electronic device 100.

The key input device 117 may be disposed on the lateral surface 110C of the housing 110. The mobile electronic device 100 may not include some or all of the key input device 117 described above, and the key input device 117 which is not included may be implemented in another form such as a soft key on the display 101. The key input device 117 may include the sensor module disposed on the second surface 110B of the housing 110.

The light emitting device may be disposed on the first surface 110A of the housing 110. For example, the light emitting device may provide status information of the electronic device 100 in an optical form. The light emitting device may provide a light source associated with the operation of the camera module 105. The light emitting device may include, for example, a light emitting diode (LED), an IR LED, or a xenon lamp.

The connector hole 108 may include a first connector hole 108 adapted for a connector (e.g., a universal serial bus (USB) connector) for transmitting and receiving power and/or data to and from an external electronic device. The connector hole 108 may include a second connector hole (not shown) adapted for a connector (e.g., an earphone jack) for transmitting and receiving an audio signal to and from an external electronic device.

Some sensor modules 105 of camera modules 105 and 212, some sensor modules 104 of sensor modules 104 and 119, or an indicator may be arranged to be exposed through a display 101. For example, the camera module 105, the sensor module 104, or the indicator may be arranged in the internal space of an electronic device 100 so as to be brought into contact with an external environment through an opening of the display 101, which is perforated up to a front plate 102. In another embodiment, some sensor modules 104 may be arranged to perform their functions without being visually exposed through the front plate 102 in the internal space of the electronic device. For example, in this case, an area of the display 101 facing the sensor module may not require a perforated opening.

Figure 3:
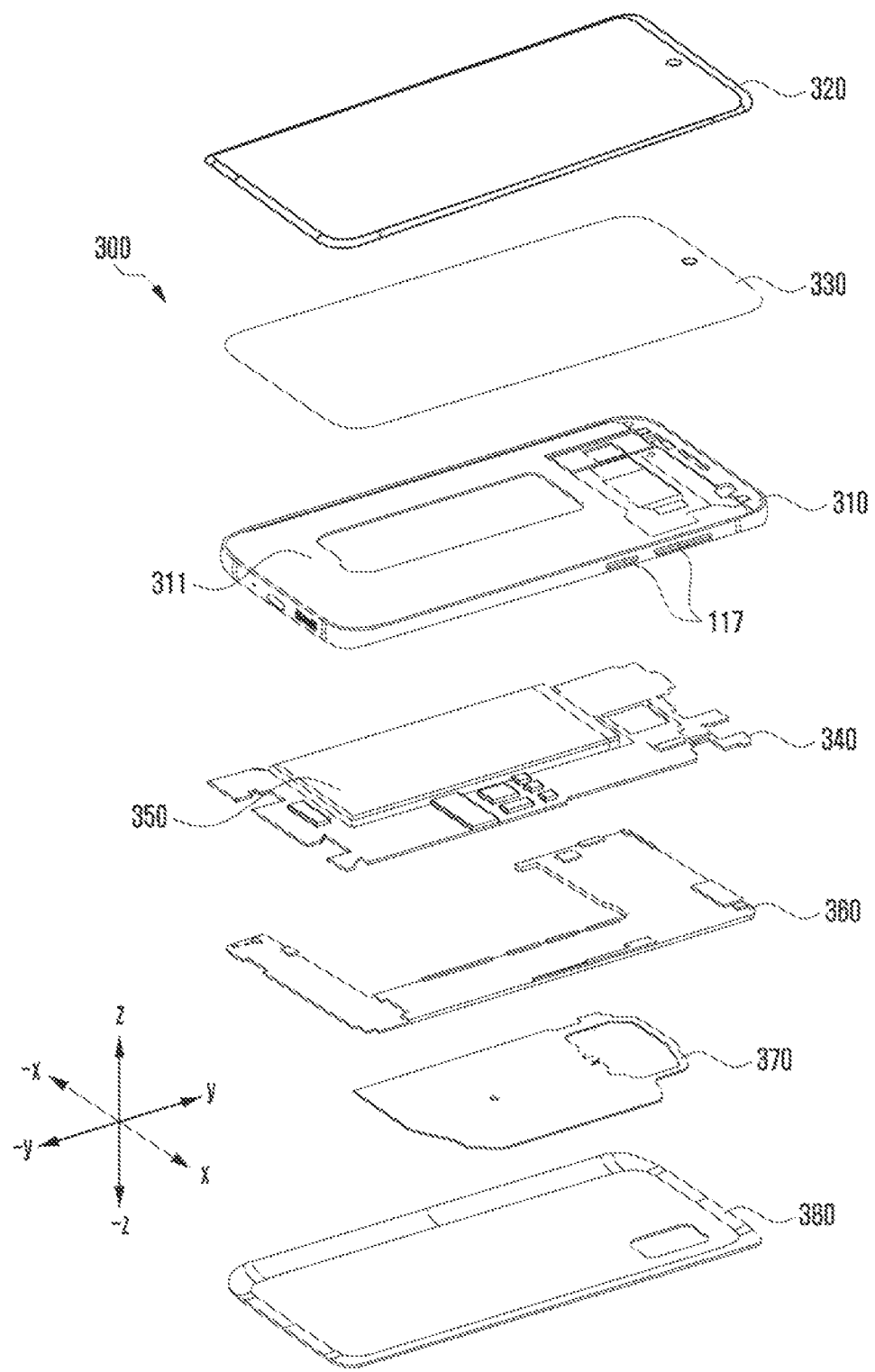
FIG. 3 is an exploded perspective view of the electronic device of FIG. 1 according to certain embodiments of the present disclosure.

FIG. 3 illustrates an exploded perspective view showing a mobile electronic device shown in FIG. 1 according to an embodiment of the disclosure.

The electronic device 300 in FIG. 3 may be at least partially similar to the electronic device 100 in FIG. 1 and FIG. 2 or may further include other embodiments.

Referring to FIG. 3, a mobile electronic device 300 may include a lateral bezel structure 310, a first support member 311 (e.g., a bracket), a front plate 320, a display 330, an electromagnetic induction panel (not shown), a printed circuit board (PCB) 340, a battery 350, a second support member 360 (e.g., a rear case), an antenna 370, and a rear plate 380. The mobile electronic device 300 may omit at least one (e.g., the first support member 311 or the second support member 360) of the above components or may further include another component. Some components of the electronic device 300 may be the same as or similar to those of the mobile electronic device 100 shown in FIG. 1 or FIG. 2, thus, descriptions thereof are omitted below.

The first support member 311 is disposed inside the mobile electronic device 300 and may be connected to, or integrated with, the lateral bezel structure 310. The first support member 311 may be formed of, for example, a metallic material and/or a non-metal (e.g., polymer) material. The first support member 311 may be combined with the display 330 at one side thereof and also combined with the printed circuit board (PCB) 340 at the other side thereof. On the PCB 340, a processor, a memory, and/or an interface may be mounted. The processor may include, for example, one or more of a central processing unit (CPU), an application processor (AP), a graphics processing unit (GPU), an image signal processor (ISP), a sensor hub processor, or a communications processor (CP).

The memory may include, for example, one or more of a volatile memory and a non-volatile memory.

The interface may include, for example, a high definition multimedia interface (HDMI), a USB interface, a secure digital (SD) card interface, and/or an audio interface. The interface may electrically or physically connect the mobile electronic device 300 with an external electronic device and may include a USB connector, an SD card/multimedia card (MMC) connector, or an audio connector.

The battery 350 is a device for supplying power to at least one component of the mobile electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the mobile electronic device 300, and may be detachably disposed from the mobile electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly. An antenna structure may be formed by a part or combination of the lateral bezel structure 310 and/or the first support member 311.

Figure 4A:
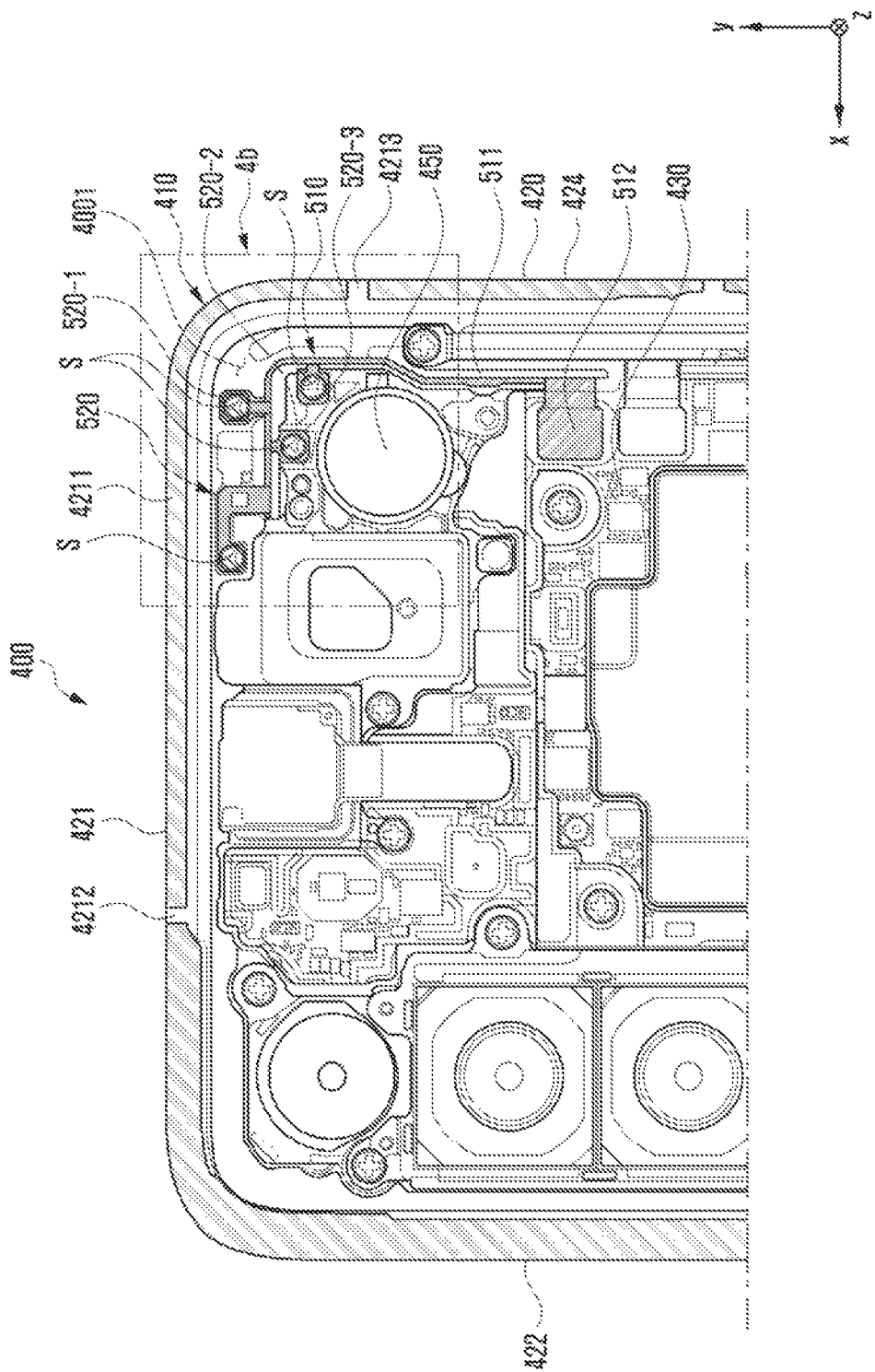
FIG. 4A is a construction diagram of a part of the electronic device according to certain embodiments of the present disclosure.
Figure 4B:
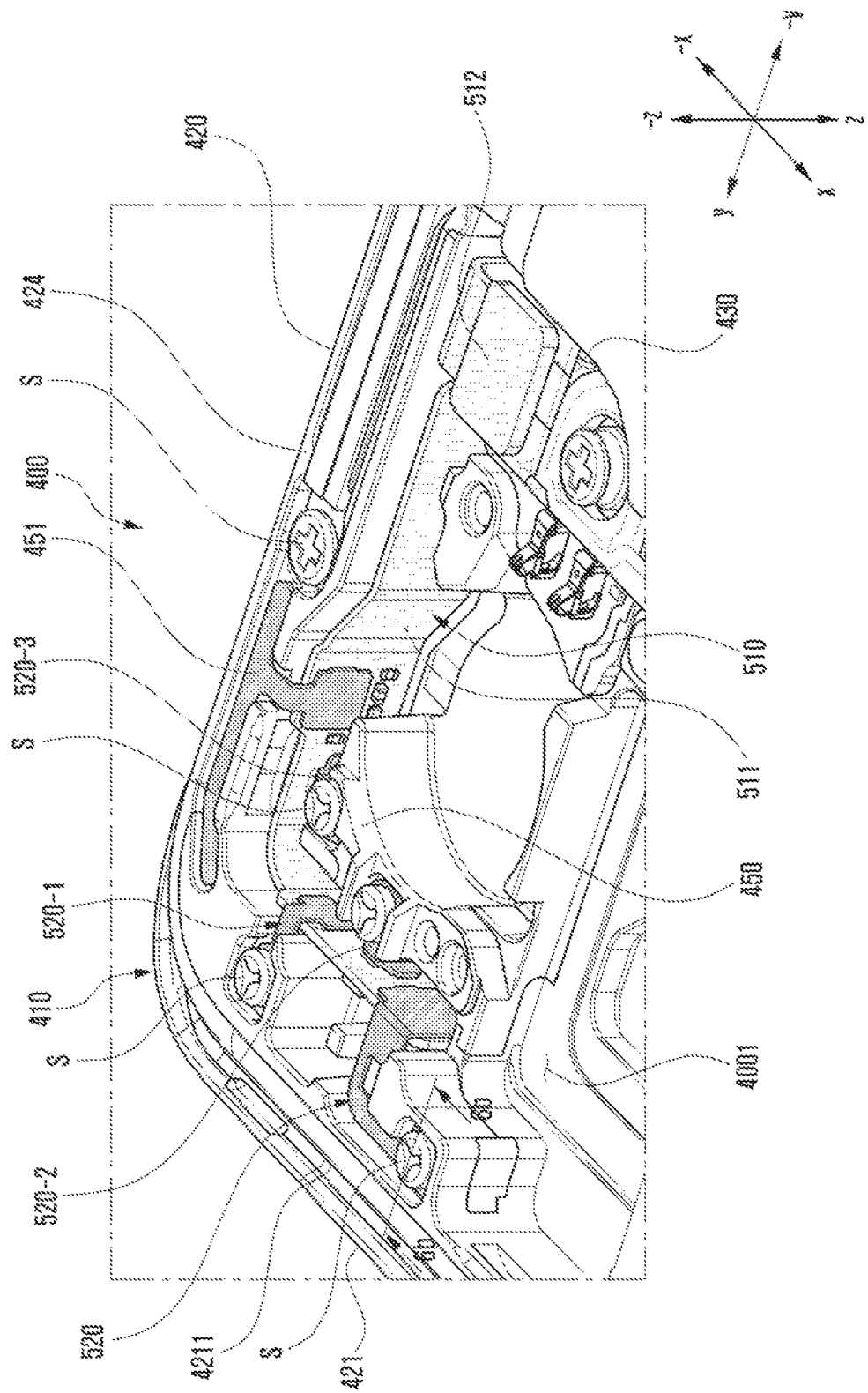
FIG. 4B is an expanded perspective view of an area 4b in FIG. 4A according to certain embodiments of the present disclosure.
Figure 5:
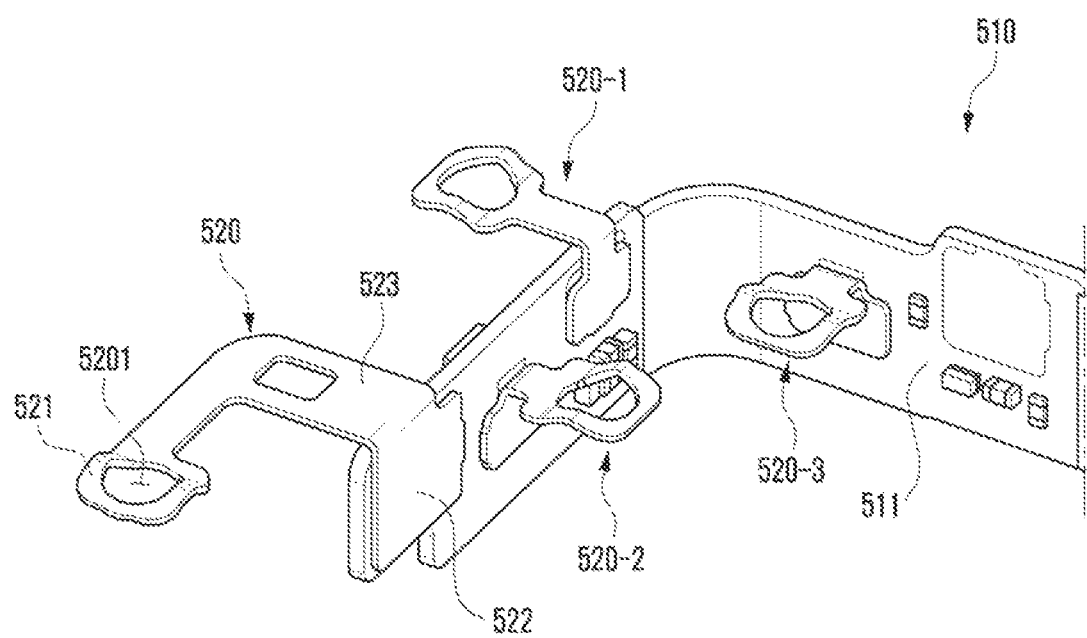
FIG. 5 is a perspective view of a flexible substrate including an electrical connection member according to certain embodiments of the present disclosure.

FIG. 4A is a construction diagram of a part of the electronic device according to certain embodiments of the present disclosure. FIG. 4B is an expanded perspective view of an area 4b in FIG. 4A according to certain embodiments of the present disclosure. FIG. 5 is a perspective view of a flexible substrate including an electrical connection member according to certain embodiments of the present disclosure.

According to certain embodiments, the electronic device 100 may include an antenna radiator (e.g., the conductive portion 4211 in FIG. 4A) serving as a conductive structure, which is disposed through at least a part of the conductive side member 118. The antenna radiator (e.g., the conductive portion 4211 in FIG. 4A) may be disposed in an upper area (e.g., an area A) and/or lower area (e.g., an area B) of the electronic device 100. At least one antenna radiator (e.g., the conductive portion 4211 in FIG. 4A) according to exemplary embodiments of the present disclosure may be disposed within the electronic device 100, and may be configured to operate in at least one frequency band (e.g., a legacy band) by being connected to the substrate 340 (e.g., a substrate 430 in FIG. 4A through a flexible substrate (e.g., a flexible substrate 510 in FIG. 4A) including an electrical connection member (e.g., an electrical connection member 520 in FIG. 4A).

With reference to FIGS. 4A to 5, the electronic device 400 (e.g., the electronic device 100 in FIG. 1 and/or the electronic device 300 in FIG. 3) may include a housing 410 (e.g., the housing 110 in FIG. 1) (e.g., a housing structure), which includes a front cover (e.g., the front plate 102 in FIG. 1) (e.g., a first cover or a first plate), a rear cover (e.g., the rear plate 111 in FIG. 2) (e.g., a second cover or a second plate) directed toward a direction opposite to the direction of the front cover, and a side member 420 (e.g., the side member 118 in FIG. 1) surrounding an internal space 4001 between the front cover and the rear cover. As shown, the side member 420 may be at least partially formed of a conductive member (e.g., a metal material).

According to certain embodiments, the side member 420 may include a first side 421 having a first length, a second side 422 elongating in a direction perpendicular to the first side 421 and having a second length longer than the first length, a third side (not illustrated) elongating in a direction parallel to the first side 421 from the second side 422 and having the first length, and a fourth side 424 elongating in the direction parallel to the second side 422 from the third side and having the second length.

According to certain embodiments, the side member 420 at least partially formed of a conductive member (e.g., a metal material) may include a conductive portion 4211 segmented by at least one non-conductive portion 4212 and 4213. It is noted that the electronic device 400 may include two or more conductive portions segmented by at least one non-conductive portion. According to an embodiment, the electronic device 400 may include the conductive portion 4211 disposed through two non-conductive portions 4212 and 4213 isolated from each other, in an upper area (e.g., the area A in FIG. 1). For example, the electronic device 400 may include the conductive portion 4211 disposed through a first non-conductive portion 4213 disposed in at least a part of the first side 421 and a second non-conductive portion 4213 disposed in at least a part of the fourth side 424. It is noted that electronic device 400 may include at least one conductive portion disposed substantially in a similar way in a lower area (not illustrated) (e.g., the area B in FIG. 1) of the side member 420.

According to certain embodiments, the electronic device 400 may include the substrate 430 (e.g., a PCB, a device substrate or a main substrate) disposed in the internal space 4001. The substrate 430 may include at least one wireless communication circuitry or a feeding portion. According to an embodiment, the substrate 430 may be electrically connected to the conductive portion 4211 through a flexible substrate 510 and an electrical connection member 520 that is electrically fixed to the flexible substrate 510. Here, the electrical connection member 520 may have its location fixed by being clamped to a screw clamping portion provided in the conductive portion through a screw S. In operation, the wireless communication circuitry disposed in the substrate 430 may be configured to transmit or receive a radio signal in at least one designated frequency band by using, as an antenna radiator, the conductive portion 4211 electromagnetically connected through the flexible substrate 510 and the electrical connection member 520.

According to certain embodiments, the electronic device 400 may include at least one additional electrical connection member 520-1, 520-2, and 520-3 electrically fixed at different locations of the flexible substrate 510 and clamped to an electrical structure disposed in the internal space of the electronic device 400. In the embodiment, some 520-1 of the at least one additional electrical connection member 520-1, 520-2, and 520-3 may be additionally clamped to the conductive portion 4211 through the screw S. Also, other 520-2 and 520-3 of the at least one additional electrical connection member 520-1, 520-2, and 520-3 may be disposed in the internal space 4001 of the electronic device 400, and may be electrically connected to a conductive bracket 450 for the purpose of a ground connection. The electrical connection member 520 and the at least one additional electrical connection member 520-1, 520-2, and 520-3 may have substantially the same clamping structure.

According to certain embodiments, the substrate 430 may be disposed at a distance far from the conductive portion 4211 in terms of a design structure of the electronic device 400. In such a case, the electronic device 400 may include the flexible substrate 510 disposed in the internal space 4001 and having a designated length in order to electrically connect the substrate 430 and the conductive portion 4211. According to an embodiment, the flexible substrate 510 may include a flexible RF cable (FRC) for electrically connecting the conductive portion 4211 used as an antenna and the wireless communication circuitry disposed in the substrate 430. The flexible substrate 510 may include a cable portion 511 having a designated length and a connector portion 512 disposed at the end of the cable portion 511 and connected to the substrate 430. According to an embodiment, the electrical connection member 520 and the at least one additional electrical connection member 520-1, 520-2, and 520-3 may be fixed to at least a part of the cable portion 511. The electrical connection member 520 and the at least one additional electrical connection member 520-1, 520-2, and 520-3 may be fixed to the cable portion 511 through a bonding process, such as soldering, conductive bonding or conductive taping. In an embodiment, if the cable portion 511 may be a relatively long length or may be disposed in a way to be at least partially bent, then there is a possibility that the cable portion 511 may be randomly moved, thus the cable portion 511 may be fixed to a designated internal space of the electronic device 400 through at least one fixing member 451.

Hereinafter, the electrical connection member 520 is described in detail.

Figure 6A:
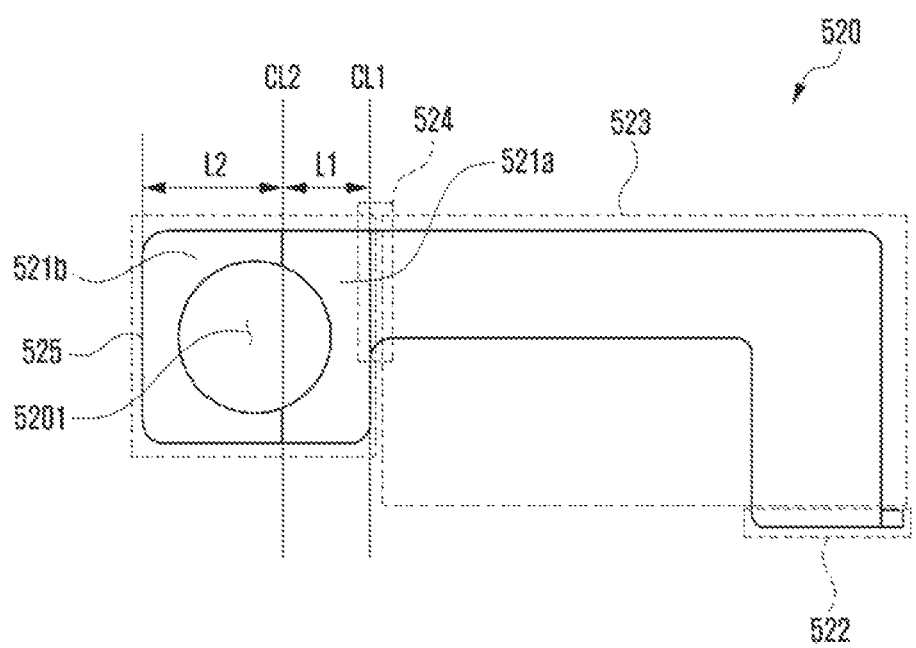
FIG. 6A is a plan view and side view of the electrical connection member according to certain embodiments of the present disclosure.
Figure 6B:
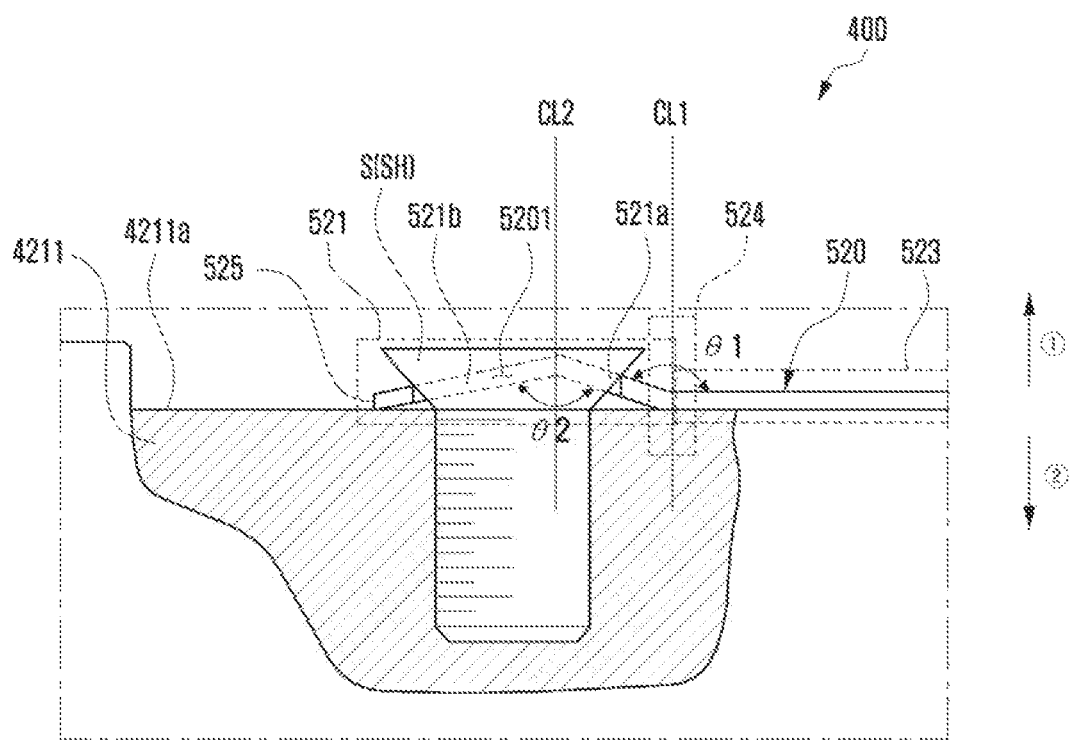
FIG. 6B is a cross-sectional view of a part of the electronic device which is viewed along line 6b-6b in FIG. 4B according to certain embodiments of the present disclosure.

FIG. 6A is a plan view and side view of the electrical connection member according to certain embodiments of the present disclosure. FIG. 6B is a cross-sectional view of a part of the electronic device which is viewed along line 6b-6b in FIG. 4B according to certain embodiments of the present disclosure.

Referring to FIGS. 6A and 6B, the electrical connection member 520 may include a first fixing portion 521 which is clamped to a fixed surface 4211a of the conductive portion 4211 through the screw S, a second fixing portion 522 which is electrically fixed to the flexible substrate 510, and a connection portion 523 connecting the first fixing portion 521 and the second fixing portion 522 and having a designated length and shape. According to an embodiment, the first fixing portion 521, the second fixing portion 522, and the connection portion 523 may be integrated. The electrical connection member 520 may be made of a metal material, such as stainless steel (SUS). The second fixing portion 522 may be electrically connected to a conductive pad exposed in a certain area of the cable portion 511 of the flexible substrate 510 through soldering. The first fixing portion 521 may include a through hole 5201 through which at least a part of the screw S penetrates. The through hole 5201 may be formed to have a diameter through which a part of the screw S penetrates and a screw head (e.g., a screw head SH in FIG. 7) does not penetrate.

According to certain embodiments, the first fixing portion 521 may include a first bent portion 521a bent from a neck portion 524, that is, a boundary point of the connection portion 523 and the first fixing portion 521, along a first bent line CL1 at a designated first angle θ1 and in a designated first direction (a direction ①), and a second bent portion 521b extended from the first bent portion 521a and bent along a second bent line CL2 at a designated second angle θ2 and in a designated second direction (a direction ②). The first angle θ1 may include a range of 90 degrees to 180 degrees with respect to the connection portion 523. The second angle θ2 may include a range of 90 degrees to 180 degrees with respect to the first bent portion 521a. According to an embodiment, the first angle θ1 and the second angle θ2 may be substantially the same. According to another embodiment, the first angle θ1 and the second angle θ2 may be different. The first direction (the direction ①) and the second direction (the direction ②) may be opposite directions. For example, the first fixing portion 521 may be formed to have an inverse "V" shape through the first bent portion 521a and the second bent portion 521b. Here, the first bent line CL1 and the second bent line CL2 may be parallel to each other. According to an embodiment, the first bent line CL1, the second bent line CL2, and the neck portion 524 may be parallel to one another. The second bent line CL2 may intersect the through hole 5201. The second bent line CL2 may intersect the through hole 5201 between the center of the through hole 5201 and the neck portion 524. According to an embodiment, a first shortest distance L1 from the first bent line CL1 to the second bent line CL2 may be shorter than a second shortest distance L2 from the second bent line CL2 to a distal portion 525 (e.g., a boundary portion) of the first fixing portion 521. In an embodiment, the first shortest distance L1 may be substantially the same as the second shortest distance L2. According to an embodiment, before being clamped by the screw S, the first fixing portion 521 may be formed in a way that the neck portion 524 and the distal portion 525 come into contact with the fixed surface 4211a when the first fixing portion 521 is placed on the fixed surface 4211a of the conductive portion 4211. According to an embodiment, before being clamped by the screw S, the first bent portion 521a may be formed to have a tilt gradually becoming closer to the fixed surface 4211a toward the neck portion 524 when the first bent portion 521a is placed on the fixed surface 4211a of the conductive portion 4211. According to an embodiment, before being clamped by the screw S, the second bent portion 521b may be formed to have a tilt gradually becoming closer to the fixed surface 4211a toward the distal portion 525 when the first fixing portion 521 being placed on the fixed surface 4211a of the conductive portion 4211.

According to certain embodiments, when the first fixing portion 521 is placed on the fixed surface 4211a of the conductive portion 4211, the neck portion 524 and distal portion 525 of the first fixing portion 521 may be brought into contact with the fixed surface 4211a. According to an embodiment, in the state in which the first fixing portion 521 has been placed on the fixed surface 4211a, when the screw S penetrates the through hole 5201, the screw head SH may be first brought into contact with a portion corresponding to the second bent line CL2 of the first fixing portion 521. Accordingly, when the screw S is clamped in the second direction (the direction ②), elastic deformation may occur because the first fixing portion 521 is supported by the neck portion 524 and the distal portion 525 brought into contact with the fixed surface 4211a and the portion corresponding to the second bent line CL2 of the first fixing portion 521 is pressed.

Figure 7:
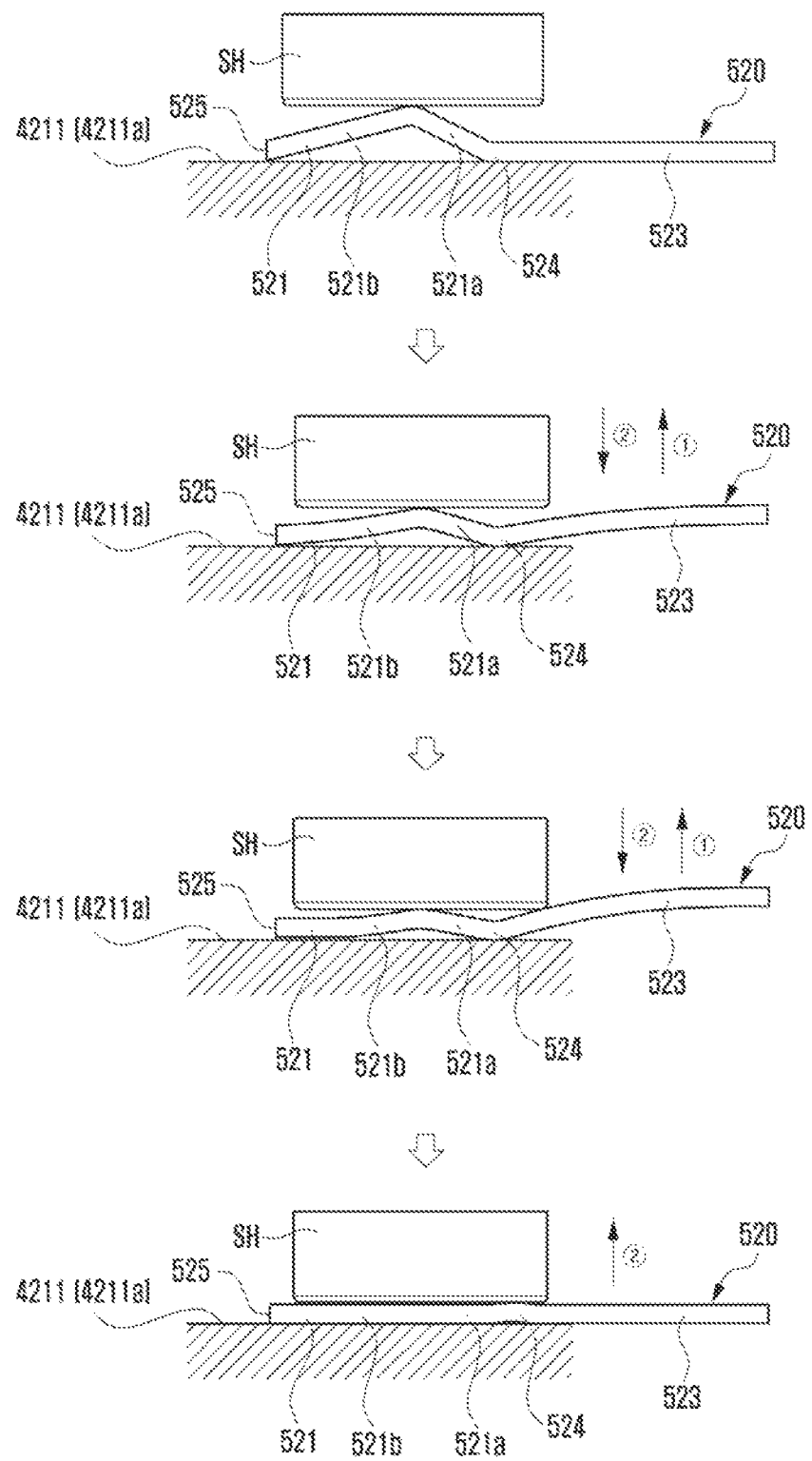
FIG. 7 is a diagram illustrating a process of the electrical connection member being clamped to a conductive structure according to certain embodiments of the present disclosure.

FIG. 7 is a diagram illustrating a process of the electrical connection member being clamped to a conductive structure according to certain embodiments of the present disclosure.

Referring to FIG. 7, when the first fixing portion 521 is placed on the fixed surface 4211a of the conductive portion 4211 before being clamped by the screw S, the neck portion 524 and the distal portion 525 may be brought into contact with the fixed surface 4211a. Through such a deployment structure, even before the screw S is clamped, the first fixing portion 521 may be stably disposed in the fixed surface 4211a. According to an embodiment, when the screw S is clamped in the second direction (the direction ②), the first fixing portion 521 may be deformed by the pressurization of the screw head SH. For example, the first bent portion 521a and the second bent portion 521b may be deformed in a way to be closer to the fixed surface 4211a by the pressurization of the screw head SH. During such a deformation process, at least a part of the connection portion 523 neighboring the neck portion 524 may rise in the first direction (the direction ①), but is brought into contact with and supported by the screw head SH after rising to some extent, so that an excessive rise of the connection portion 523 can be suppressed. Such suppression of an excessive rise of the connection portion 523 may help to reduce a stress concentration phenomenon of the second fixing portion 522 extended from the connection portion 523. Through such a reduction of the stress concentration phenomenon, a disconnection and/or crack phenomenon in a fixed portion of the second fixing portion 522 and the flexible substrate 510 can be reduced. According to an embodiment, when the screw S is fully clamped to the fixed surface 4211a, the first fixing portion 521 may be stretched to be parallel to the connection portion 523 through the screw head SH, and may have a repulsive force for pushing the screw S in the first direction (the direction ①). Such a repulsive force may help to reduce a phenomenon in which the screw S is randomly released from the fixed surface 5211a.

Figure 8:
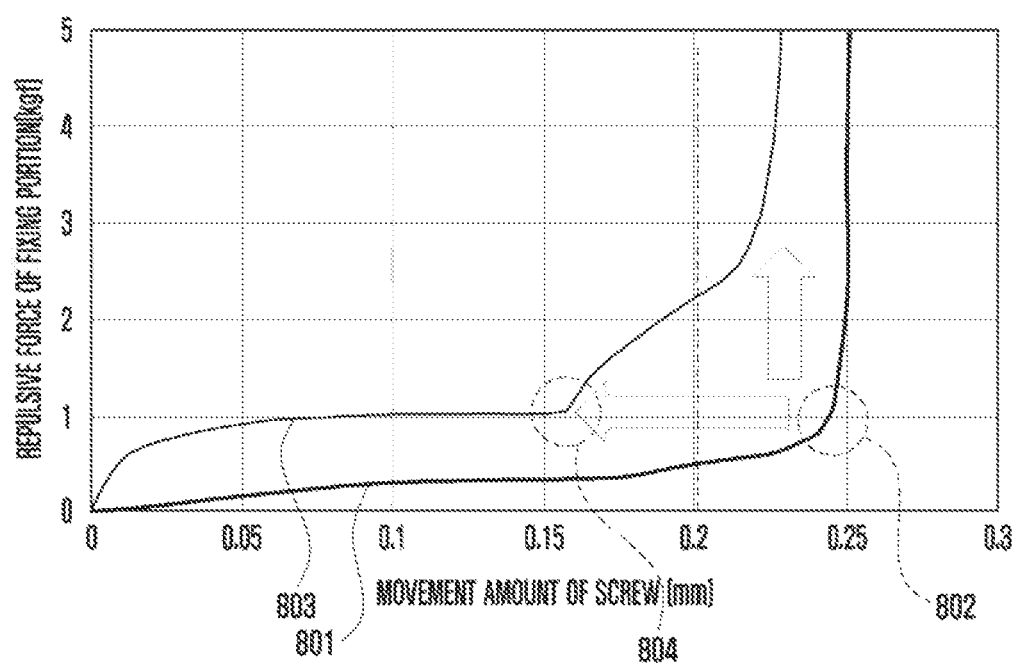
FIG. 8 is a graph comparing relations between repulsive forces of the electrical connection member according to screw clamping operations according to certain embodiments of the present disclosure.

FIG. 8 is a graph comparing relations between repulsive forces of the electrical connection member during screw clamping operations according to certain embodiments of the present disclosure.

FIG. 8 is a graph illustrating relations between repulsive forces of the first fixing portion 521 according to movements of the screw S when clamping. In a conventional fixing portion, a repulsive force occurs (a graph 801) at timing (an area 802) at which the screw is almost clamped. In contrast, in the first fixing portion 521 according to an exemplary embodiment of the present disclosure, as deformation timing (an area 804) is relatively advanced or earlier, a repulsive force may occur (a graph 803) while the screw is being clamped (e.g., when the screw is clamped by half). As the deformation start section of the first fixing portion 521 is advanced during the screw clamping operation, a repulsive force is relatively increased in the same section which in turn help to improve clamping reliability.

For example, although the screw S is clamped (a loose insertion) to some extent without being fully clamped, the first fixing portion 521 may be electrically connected to the conductive member 4211 through a repulsive force that has previously occurred, thereby helping to improve mass-production stability. Furthermore, it is apparent that the repulsive force of the first fixing portion 521 according to an exemplary embodiment of the present disclosure occurs earlier than the repulsive force of the conventional fixing portion until the screw clamping is completed.

According to certain embodiments, an electronic device (e.g., the electronic device 400 in FIG. 4) may include a housing (e.g., the housing 410 in FIG. 4), a first substrate (e.g., the substrate 430 in FIG. 4) disposed in an internal space (e.g., the internal space 4001 in FIG. 4) of the housing, a conductive structure (e.g., the conductive portion 4211 in FIG. 4) disposed at a location isolated from the first substrate, a second substrate (e.g., the flexible substrate 510 in FIG. 4) electrically connecting the conductive structure and the first substrate, and an electrical connection member (e.g., the electrical connection member 520 in FIG. 4) electrically connecting the second substrate to the conductive structure. The electrical connection member may include a first fixing portion (e.g., the first fixing portion 521 in FIG. 6B) fixed to the conductive structure, a second fixing portion (e.g., the second fixing portion 522 in FIG. 6B) fixed to the second substrate, and a connection portion (e.g., the connection portion 523 in FIG. 6B) connecting the first fixing portion and the second fixing portion. The first fixing portion may include a first bent portion (e.g., the first bent portion 521a in FIG. 6B) bent from a neck portion (e.g., the neck portion 524 in FIG. 6B), that is, a boundary area with the connection portion, along a first bent line (e.g., the first bent line CL1 in 6B) and a second bent portion (e.g., the second bent portion 521b in FIG. 6B) bent from the first bent portion along a second bent line (e.g., the second bent line CL2 in FIG. 6B). The first bent portion may be bent in a first direction (e.g., the direction θ in FIG. 6B) becoming distant from the conductive structure. The second bent portion may be bent in a second direction (e.g., the direction ② in FIG. 6B) opposite to the first direction.

According to certain embodiments, the first bent line and the second bent line may be parallel to each other.

According to certain embodiments, a first shortest distance from the first bent line to the second bent line may be shorter than the shortest distance from the second bent line to a distal portion of the first fixing portion.

According to certain embodiments, each of a first bent angle of the first bent portion on the basis of the connection portion and a second bent angle of the second bent portion on the basis of the first bent portion may be a range of 90 degrees to 180 degrees.

According to certain embodiments, the first bent angle and the second bent angle may be substantially the same.

According to certain embodiments, the first bent angle and the second bent angle may be different.

According to certain embodiments, the fixing portion may include a through hole for screw penetration, and the second bent line may intersect the through hole.

According to certain embodiments, the second bent line may intersect the through hole between the center of the through hole and the neck portion.

According to certain embodiments, a bent angle of each of the first bent portion and the second bent portion may be determined so that the neck portion and a distal portion of the first fixing portion are brought into contact with a fixed surface of the conductive structure when the first fixing portion is placed on the fixed surface.

According to certain embodiments, the first bent portion may be formed to have a tilt gradually becoming closer to a fixed surface of the conductive structure toward the neck portion when the first fixing portion is placed on the fixed surface.

According to certain embodiments, the second bent portion may be formed to have a tilt gradually becoming closer to a fixed surface of the conductive structure toward a distal portion of the first fixing portion when the first fixing portion is placed on the fixed surface.

According to certain embodiments, the first bent portion and the second bent portion may be deformed to form the same plane as the connection portion when the clamping of the first fixing portion to the conductive structure through a screw is completed.

According to certain embodiments, the housing includes a first plate, a second plate directed toward a direction opposite to a direction of the first plate, and a side member surrounding a space between the first plate and the second plate and including at least partially a conductive portion. The conductive structure may be the conductive portion.

According to certain embodiments, the conductive portion may operate as an antenna by being segmented through at least one non-conductive segmentation portion.

According to certain embodiments, a display disposed in the space and disposed to be seen from the outside through at least a part of the first plate may be included.

According to certain embodiments, the conductive structure may include a conductive bracket disposed in an internal space of the electronic device and used for a ground connection.

According to certain embodiments, the second substrate may include a flexible RF cable (FRC) or a flexible printed circuit board (FPCB) connecting the conductive structure used as an antenna and the first substrate.

According to certain embodiments, the first substrate may include a flexible substrate. The second fixing portion may be electrically connected to at least a part of the flexible substrate through soldering.

According to certain embodiments, the first fixing portion, the second fixing portion, and the connection portion may be integrated.

According to certain embodiments, the electrical connection member may be made of a metal material having a plate form.

Furthermore, embodiments of the present disclosure disclosed in this specification and drawings have merely presented specific examples in order to easily describe technical contents according to the embodiments of the present disclosure and to help understanding of the embodiments of the present disclosure, but are not intended to limit the scope of the embodiments of the present disclosure. Accordingly, all changes or modified forms derived based on the technical spirit of various embodiments of the present disclosure should be construed as being included in the scope of various embodiments of the present disclosure in addition to the embodiments disclosed herein.

The invention claimed is:

1. An electronic device comprising:
a housing;
a first substrate disposed inside of the housing;
a conductive structure spaced apart from the first substrate;
a second substrate electrically coupled to the conductive structure and the first substrate; and
an electrical connection member electrically connecting the second substrate to the conductive structure,
wherein the electrical connection member comprises:
a first fixing portion fixed to the conductive structure;
a second fixing portion fixed to the second substrate; and
a connection portion connecting the first fixing portion and the second fixing portion,
the first fixing portion comprises a first bent portion extending from a neck portion of the connection portion and bent along a first bent line and a second bent portion extending from the first bent portion and bent along a second bent line,
the first bent portion is bent in a first direction and distant from the conductive structure, and the second bent portion is bent in a second direction opposite to the first direction, and
a first shortest distance from the first bent line to the second bent line is shorter than a shortest distance from the second bent line to a distal portion of the first fixing portion.

2. The electronic device of claim 1, wherein the first bent line and the second bent line are parallel to each other.

3. The electronic device of claim 1, wherein each of a first bent angle of the first bent portion relative to the connection portion and a second bent angle of the second bent portion relative to the first bent portion is a range of 90 degrees to 180degrees.

4. The electronic device of claim 3, wherein the first bent angle and the second bent angle are substantially identical.

5. The electronic device of claim 3, wherein the first bent angle and the second bent angle are different.

6. The electronic device of claim 1, wherein the first fixing portion comprises a through hole for screw penetration, and the second bent line intersects the through hole.

7. The electronic device of claim 6, wherein the second bent line intersects the through hole between a center of the through hole and the neck portion.

8. The electronic device of claim 1, wherein a bent angle of each of the first bent portion and the second bent portion is determined so that the neck portion and a distal portion of the first fixing portion are brought into contact with a fixed surface of the conductive structure when the first fixing portion is placed on the fixed surface.

9. The electronic device of claim 1, wherein the first bent portion is formed to have a tilt gradually becoming closer to a fixed surface of the conductive structure toward the neck portion when the first fixing portion is placed on the fixed surface.

10. The electronic device of claim 1, wherein the second bent portion is formed to have a tilt gradually becoming closer to a fixed surface of the conductive structure toward a distal portion of the first fixing portion when the first fixing portion is placed on the fixed surface.

11. The electronic device of claim 1, wherein the first bent portion and the second bent portion are deformed to form a plane identical with a plane of the connection portion when clamping of the first fixing portion to the conductive structure through a screw is completed.

12. The electronic device of claim 1, wherein the housing comprises:
 a first plate;
 a second plate directed toward a direction opposite to a direction of the first plate; and
 a side member surrounding a space between the first plate and the second plate and comprising at least partially a conductive portion, and
 wherein the conductive structure is the conductive portion.

13. The electronic device of claim 12, wherein the conductive portion operates as an antenna by being segmented through at least one non-conductive segmentation portion.

14. The electronic device of claim 12, further comprising a display disposed in the space and visible through at least a part of the first plate.

15. The electronic device of claim 1, wherein the conductive structure comprises a conductive bracket disposed in an internal space of the electronic device and used for a ground connection.

16. The electronic device of claim 1, wherein the second substrate comprises a flexible RF cable (FRC) or a flexible printed circuit board (FPCB) connecting the conductive structure used as an antenna and the first substrate.

17. The electronic device of claim 1, wherein:
 the first substrate comprises a flexible substrate, and
 the second fixing portion is electrically connected to at least a part of the flexible substrate through soldering.

18. The electronic device of claim 1, wherein the first fixing portion, the second fixing portion, and the connection portion are integrated.

19. The electronic device of claim 1, wherein the electrical connection member is made of a metal material having a plate shape.

* * * * *